(12) United States Patent
Kaper et al.

(10) Patent No.: US 10,092,854 B2
(45) Date of Patent: Oct. 9, 2018

(54) DEVICE AND METHOD FOR APPLYING A MATERIAL TO A SUBSTRATE

(71) Applicant: SMIT THERMAL SOLUTIONS B.V., Son en Breugel (NL)

(72) Inventors: Gerard Kaper, Waalre (NL); Petrus Johannes Franciscus Diepens, Son (NL)

(73) Assignee: SMIT THERMAL SOLUTIONS B.V., Son (NL)

( * ) Notice: Subject to any disclaimer, the term of this patent is extended or adjusted under 35 U.S.C. 154(b) by 416 days.

(21) Appl. No.: 14/891,410

(22) PCT Filed: May 12, 2014

(86) PCT No.: PCT/NL2014/050297
§ 371 (c)(1),
(2) Date: Nov. 16, 2015

(87) PCT Pub. No.: WO2014/185776
PCT Pub. Date: Nov. 20, 2014

(65) Prior Publication Data
US 2016/0074772 A1    Mar. 17, 2016

(30) Foreign Application Priority Data

May 16, 2013  (NL) .................................... 2010809

(51) Int. Cl.
*H01L 21/67* (2006.01)
*B01D 5/00* (2006.01)
(Continued)

(52) U.S. Cl.
CPC ............. *B01D 5/0093* (2013.01); *B01D 1/14* (2013.01); *B01D 5/006* (2013.01); *B01D 5/009* (2013.01);
(Continued)

(58) Field of Classification Search
CPC ......... H01L 21/67155; H01L 21/67161; H01L 21/67167; H01L 21/67173;
(Continued)

(56) References Cited

U.S. PATENT DOCUMENTS

| 968,926 A | * | 8/1910 | Fischer | ...................... F04F 1/18 |
| | | | | 261/124 |
| 4,442,143 A | * | 4/1984 | Reed | ...................... B05D 3/046 |
| | | | | 118/58 |

(Continued)

FOREIGN PATENT DOCUMENTS

| CN | 101978091 A | 2/2011 |
| CN | 103021905 A | 4/2013 |

(Continued)

OTHER PUBLICATIONS

Chinese Search Report dated Apr. 19, 2017, in corresponding to Chinese Application No. 2014800354606, an English translation provided.

(Continued)

*Primary Examiner* — Rudy Zervigon
(74) *Attorney, Agent, or Firm* — Young & Thompson

(57) ABSTRACT

Device for heating a substrate includes a process chamber having a first and a second sealable opening for a substrate to pass through, a first inlet for receiving a process gas and a first outlet for discharging an off-gas; an evaporator for evaporating the material, which evaporator device is connected to the chamber for supplying the process gas; a first condensation device connected to the chamber for receiving the off-gas and condensing the material in the vapour phase in the off-gas to form a solid phase and a second condensation device for condensing part of the material in vapour phase in the off-gas to form a liquid phase, which second condensation device connects the first condensation device to the discharge duct and a connecting duct between the (Continued)

Figure 1:
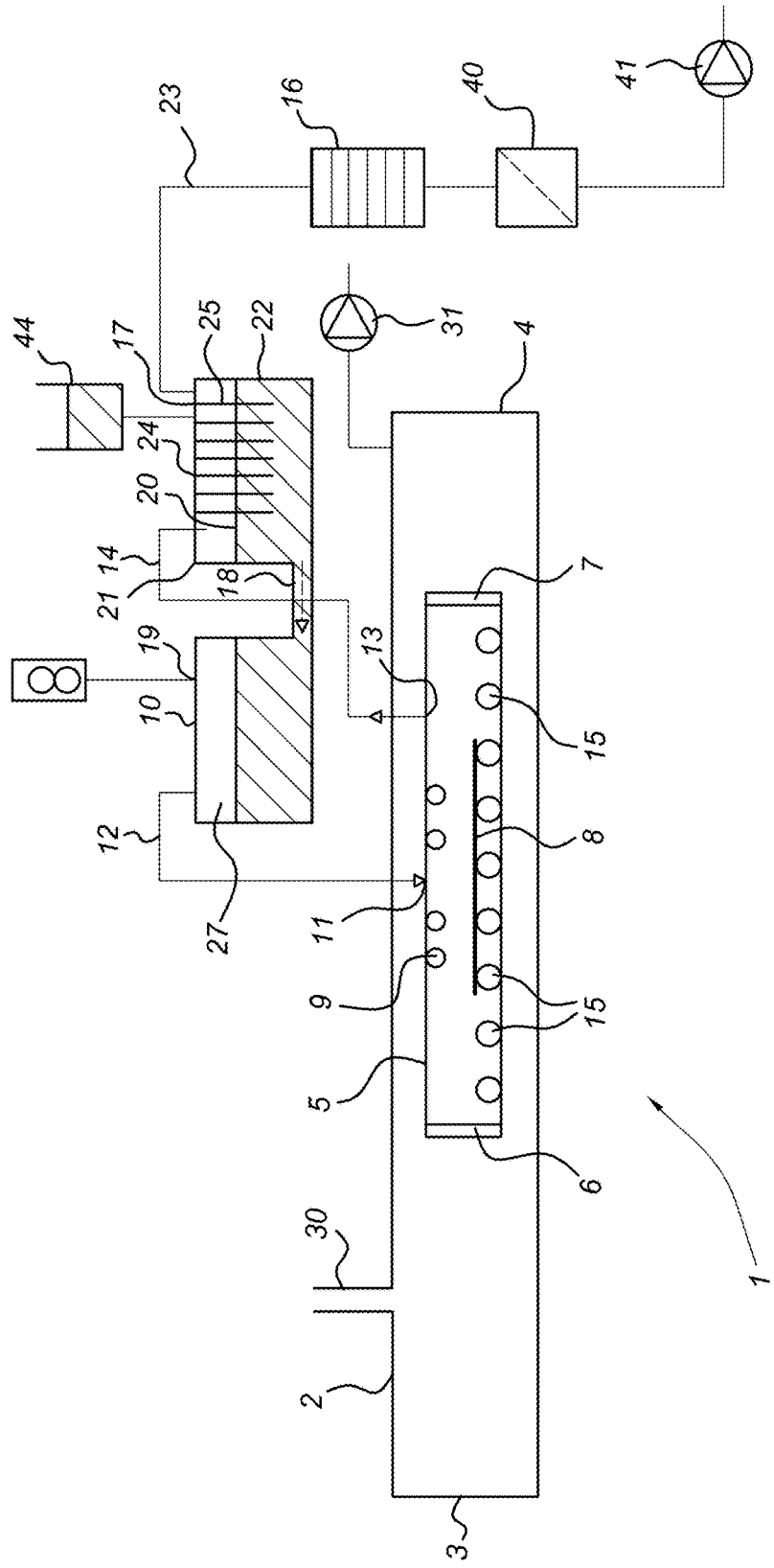

evaporator device and the second condensation device for transporting material in the liquid phase between the second condensation device and the evaporator.

18 Claims, 3 Drawing Sheets

(51) Int. Cl.
  *C23C 14/24* (2006.01)
  *B01D 1/14* (2006.01)
  *B01D 7/00* (2006.01)
  *H01L 21/324* (2006.01)

(52) U.S. Cl.
  CPC ............... *B01D 7/00* (2013.01); *C23C 14/24* (2013.01); *C23C 14/246* (2013.01); *H01L 21/324* (2013.01); *H01L 21/67017* (2013.01); *H01L 21/6719* (2013.01); *H01L 21/67109* (2013.01); *H01L 21/67155* (2013.01); *H01L 21/67161* (2013.01); *H01L 21/67167* (2013.01); *H01L 21/67173* (2013.01); *H01L 21/67178* (2013.01); *H01L 21/67184* (2013.01); *H01L 21/67196* (2013.01); *H01L 21/67201* (2013.01)

(58) Field of Classification Search
  CPC ......... H01L 21/67178; H01L 21/67184; H01L 21/6719; H01L 21/67196; H01L 21/67201
  USPC .................... 118/719; 156/345.31, 345.32
  See application file for complete search history.

(56) References Cited

U.S. PATENT DOCUMENTS

| | | | |
|---|---|---|---|
| 4,793,338 A * | 12/1988 | Andrews | A62B 23/02 128/200.11 |
| 5,578,503 A | 11/1996 | Karg et al. | |
| 5,671,612 A | 9/1997 | Menzenski | |
| 6,258,171 B1 * | 7/2001 | Agarwal | C23C 16/4405 118/715 |
| 9,214,366 B2 | 12/2015 | Park | |
| 2008/0175993 A1 | 7/2008 | Ashjaee et al. | |
| 2009/0017206 A1 * | 1/2009 | Clark | C23C 16/4412 427/248.1 |
| 2009/0238972 A1 * | 9/2009 | Clark | C23C 16/24 427/255.28 |
| 2013/0019909 A1 | 1/2013 | Park | |
| 2013/0118408 A1 * | 5/2013 | Faurie | C30B 29/403 118/726 |

FOREIGN PATENT DOCUMENTS

| | | |
|---|---|---|
| EP | 0771887 | 5/1997 |
| EP | 1616610 | 1/2006 |
| WO | 99/13545 | 3/1999 |
| WO | 2009/151665 | 12/2009 |
| WO | 2010/092471 A2 | 8/2010 |
| WO | 2012/023027 A1 | 2/2012 |
| WO | 2013/009630 A1 | 1/2013 |

OTHER PUBLICATIONS

International Search Report dated Jun. 27, 2014, corresponding to PCT/NL2014/050297.

* cited by examiner

DEVICE AND METHOD FOR APPLYING A MATERIAL TO A SUBSTRATE

The invention relates to a device and a method for heating a substrate according to a predetermined temperature profile for crystallizing a material on the substrate.

A device of this type is known from U.S. Pat. No. 5,578,503 and is also referred to as a Rapid Thermal Processor (RTP). The known device is used to successively heat and cool a substrate according to a specific temperature profile, for example for crystallizing a material on the substrate. A previously applied selenium layer is used, inter alia, to produce a light-absorbing film layer which comprises copper (Cu), indium (I), gallium (Ga) and/or selenium (Se) and is used, for example, to improve the photoelectric efficiency of solar cells. The known device can be used to crystallize this base material, which comprises, for example, copper, indium, gallium and/or selenium, in a controlled atmosphere of a process gas which comprises, for example, a vapour of a material to be crystallized.

The known device may comprise several process chambers, each of which is subjected to a specific temperature profile by heating these process chambers by means of heating elements. The known device may also be provided with a gas inlet for allowing a purge gas to flow into the housing, for example nitrogen ($N_2$) for producing a low-oxygen environment. In a subsequent process chamber, a different temperature may be set in accordance with the temperature profile to be followed which is desired to carry out recrystallization. Furthermore, the process chambers contain a controlled atmosphere, for example containing a process gas which comprises, for example, selenium vapour, so that the recrystallization takes place at a certain phase transition. The known device is furthermore provided with transporting means for transporting the substrate into and out of the process chamber via the first and the second opening, respectively. The process chamber is furthermore provided with a first transport duct for discharging an off-gas which comprises part of the process gas and the purge gas. This outlet is connected to a first condensation device. In this first condensation device, the off-gas is cooled and the material is condensed from the vapour phase to a solid state. In the known device, this condensation device is referred to as a "cold trap". A drawback of the known device is that the material is condensed in solid form, for example flakes or granules, and must be discharged to a recycling plant in order to be made suitable for reuse once again.

It is an object of the invention to provide a device which realizes a more efficient use of the material to be crystallized.

According to a first aspect of the invention, this object is achieved by a device for heating a substrate according to a predetermined temperature profile for crystallizing a material on the substrate, provided with at least one process chamber which is provided with a first and a second sealable opening for a substrate to pass through, a first inlet for receiving a process gas in the process chamber and a first transport member for transporting an off-gas from the process chamber, an evaporator device for evaporating the material, which evaporator device is connected to the first inlet for supplying the process gas to the process chamber, wherein the process gas is partially saturated with the material in vapour phase, a first condensation device for receiving the off-gas, which device is connected to the process chamber via the first transport member for transporting the off-gas to the first condensation device and wherein the first condensation device is designed to condense the material in the vapour phase in the off-gas to form a solid phase, wherein the device is further provided with a second condensation device for condensing part of the material in the vapour phase in the off-gas to form a liquid phase, which second condensation device connects the first condensation device to the process chamber via the first transport member; and a second transport member between the evaporator device and the second condensation device for transporting the material in the liquid phase from the second condensation device to the evaporator device.

By condensing part of the material in vapour phase from the off-gas to form the liquid phase and returning part of the material in the liquid phase from the second condensation device to the evaporator device, this part of the material which leaves the process space via the off-gas can be recovered and reused without the material being converted to a solid state. An example of such a material is selenium (Se), silver (Ag) or sulphur (S).

A further advantage is that a material stream between the second condensation device and the evaporating device functions as a gas separation, by means of which the process gas and the off-gas are respectively supplied and discharged separately. A material stream in the liquid phase also remains inside the device between the second condensation device and the evaporator device. This results in a device which is safe and energy-efficient. An advantage of recirculating the evaporated material is that it is possible to achieve lower consumption and a further advantage is that the material remains inside the device, as a result of which it is not necessary to subject this, possibly toxic, material to further processing.

A further advantage is that possible impurities in the off-gas can be discharged to the first condensation device and the condensed material in the second condensation device can retain a high purity. By setting the temperature in the second condensation device to be above the condensation point of a possible impurity, said impurity can be discharged to the first condensation device in the residue of the off-gas and it will not end up in the recovered material to be condensed. By means of this embodiment, it is possible to counteract cross-contamination between another process chamber, in which for example sulphur (S) is processed, and the selenium bath.

In a further embodiment of the device, the connecting duct, the evaporator device and the second condensation device are arranged in such a way that the liquid level of the material in the liquid phase which is to be evaporated is substantially equal to the liquid level of the material in the liquid phase which is to be condensed. By means of this arrangement, the evaporator device and the second condensation device act as communicating vessels, with a change in the discharge of the evaporated material from the evaporator device being automatically compensated by a change of equal magnitude in the supply through the connecting duct to the evaporator device.

In a further embodiment of the device, the first connecting duct is connected to the first end of the second condensation device. In this embodiment, there is the smallest temperature difference between the material in the evaporator device and the second condensation device. An advantage of this is that a material having a higher viscosity in the condensation device becomes warmer on the side of the evaporator chamber, as a result of which the material will flow more smoothly.

A further embodiment of the device comprises a third transport member which is connected to the second end of the second condensation device and the first condensation device and is designed to discharge a residue of the off-gas from the second condensation device to the first condensation device. As a result of this construction, discharge gas can flow from the process chamber to the second condensation device in order to be cooled there to the condensation temperature of the liquid phase. From the second condensation device the off-gas can flow into the first condensation device where it is cooled even further, so that the remaining vapour can condense/be deposited as a solid material.

In a further embodiment of the device, the second condensation device is provided with a heating device which is designed to heat the material in the liquid state which is to be condensed to a temperature which is at least higher than the temperature of the melting point of the material. This embodiment can be used to start the recirculation and, when the recirculation is operational, this heating device can be used to regulate the temperature to a preset value.

In a further embodiment, the heating device is designed to heat the off-gas in the second condensation device to a temperature which is at least higher than the temperature of the melting point of impurities in the off-gas. An example of such an impurity is sulphur (S). Sulphur is supplied in vapour phase to a final process chamber. Traces of this sulphur may diffuse into the process chambers in which selenium is processed. This can cause a problem if the concentration of sulphur (S) in the selenium material exceeds a certain value. By selecting the correct condensation temperature of the selenium (Se), it is possible to ensure that the sulphur, at a low partial pressure of the sulphur, does not condense or condenses to a far lesser degree into the liquid phase. In a further embodiment of the device, the second condensation device is provided with a labyrinth system comprising a plurality of plates, with each plate being provided with an opening for allowing the off-gas to pass through, wherein the labyrinth system is arranged between the first end and the second end of the second condensation device. The labyrinth system improves the heat exchange between the off-gas and the surroundings, with it being possible for condensation heat to be dissipated. The plates are made of a material which is resistant to selenium and sulphur at high temperatures, for example ceramic or graphite.

In a further embodiment of the device, the ceramic plates extend below a liquid level of the material in liquid phase which is to be condensed.

In a further embodiment of the device, the device is provided with transport axles which are rotatably arranged in the process chamber and passages in the process chamber for rotatably attaching the transport axles, which passages are provided with a discharge duct which connects the passages for discharging a leakage gas. A leakage gas which leaks through the passage is discharged through the discharge duct.

In a further embodiment of the device, the device is provided with a third condensation device for receiving the leakage gas via the first discharge duct for transporting the leakage gas to the third condensation device, wherein the third condensation device is designed to condense the material in the vapour phase in the leakage gas to form a solid phase;

a fourth condensation device for condensing part of the material in vapour phase in the leakage gas to form a liquid phase, which fourth condensation device connects the third condensation device to the discharge duct; and a fourth transport member between the fourth condensation device and the evaporator device for transporting condensed material from the fourth condensation device to the evaporator device. By means of the third and fourth condensation devices which receive the leakage gas which leaks through the passages and condense it into respectively a solid phase and a liquid phase, the liquid phase can be returned directly to the evaporator device. An advantage of the third and the fourth condensation device is that the gas streams of respectively the off-gas through the first transport member and the leakage gas through the discharge duct can be set independently of one another.

According to a second aspect of the invention, the above-described object is achieved by a method for applying a material to a substrate, comprising evaporating the material by melting the material to form a liquid and evaporating the liquid, supplying a process gas to the process chamber, said gas comprising part of the material in vapour phase; discharging an off-gas from the process chamber, said off-gas comprising part of the process gas; condensing at least part of the material from the off-gas to form a condensate; supplying the condensate to the liquid.

Although the invention will be described with reference to a number of preferred embodiments, the invention is not limited thereto. The embodiments discussed below are only examples of possible interpretations of the invention and it will be clear to the person skilled in the art that the advantages of the invention can also be achieved in another way.

Figure 2:
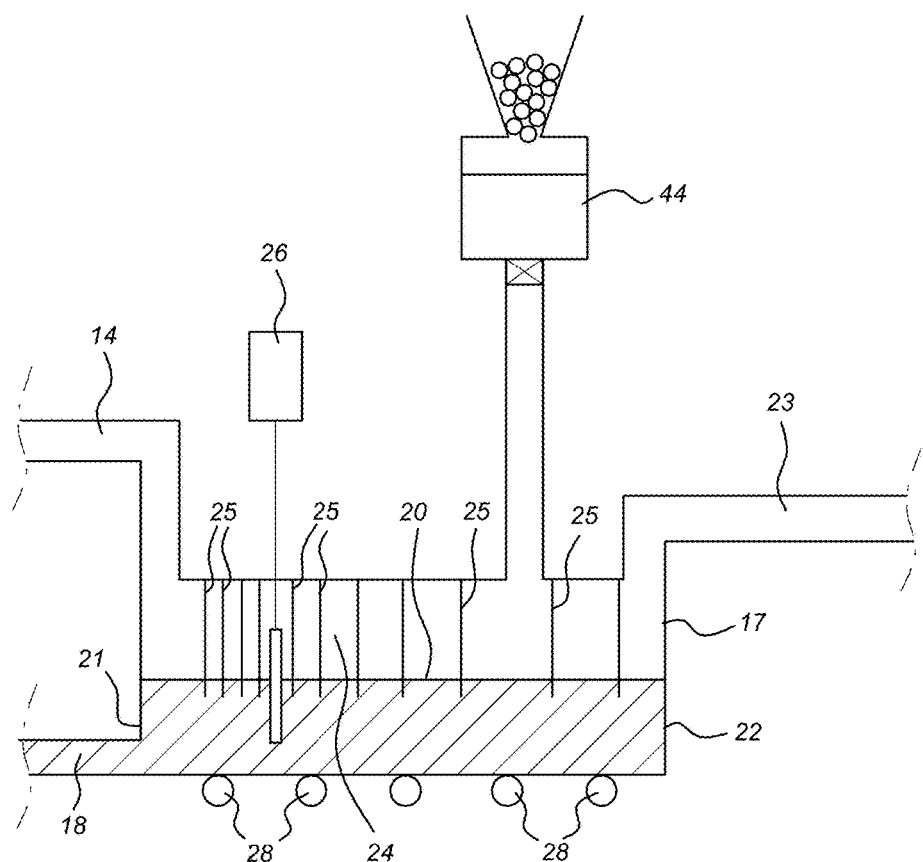
Figure 3:
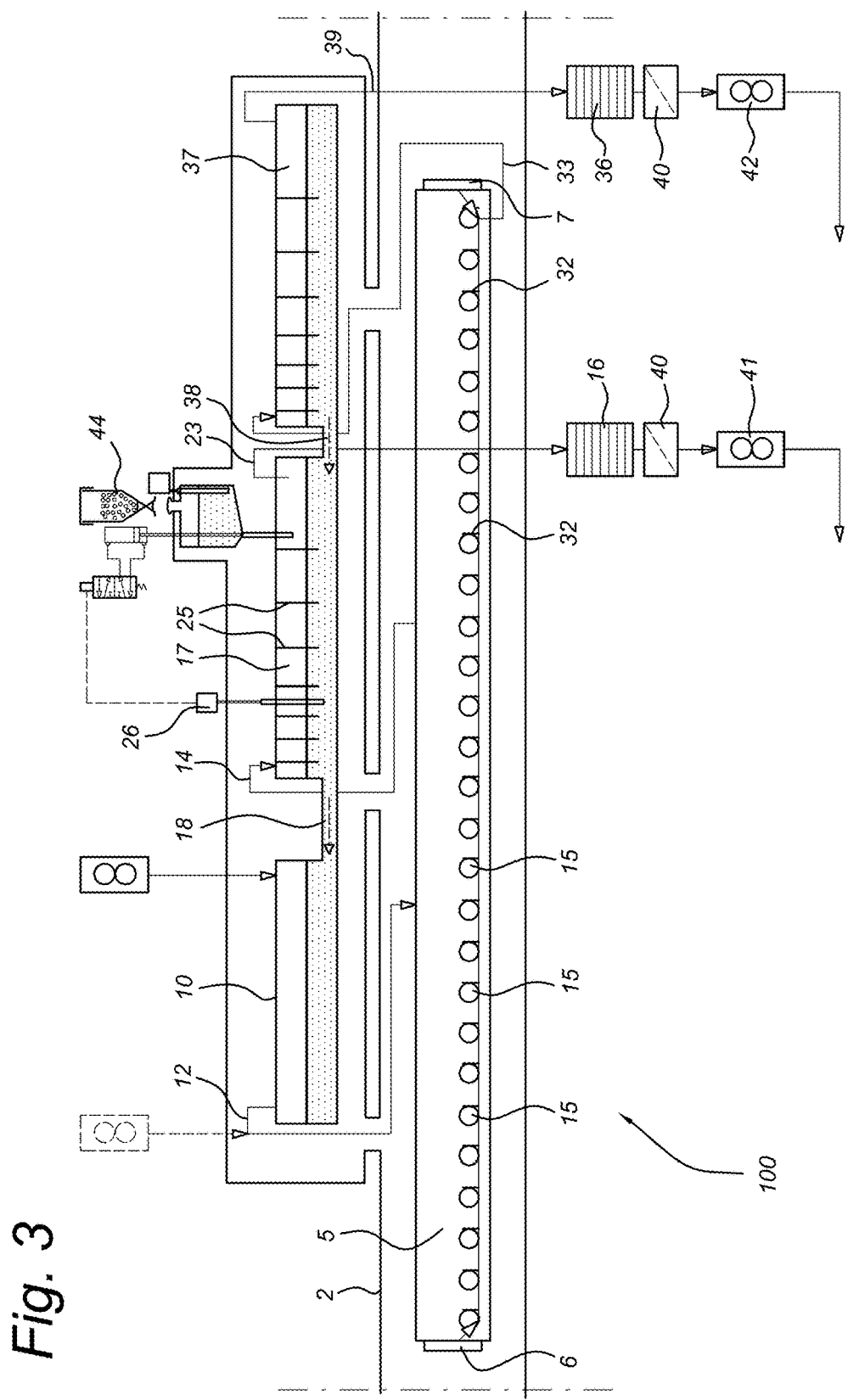

The invention will be described in more detail with reference to the attached drawings, in which:

FIG. 1 diagrammatically shows a first embodiment of the device for applying a material to a substrate according to the invention;

FIG. 2 diagrammatically shows a cross section of a second condensation device; and FIG. 3 diagrammatically shows part of a second embodiment of the invention for applying a material to a substrate according to the invention.

In the figures, identical objects are denoted by the same reference numerals.

FIG. 1 diagrammatically shows a first embodiment of a device 1 for heating a substrate according to a predetermined temperature profile for crystallizing a material on the substrate. Such a device 1 is also referred to as a Rapid Thermal Processor (RTP) and is used, for example, for manufacturing a number of photovoltaic solar cells from a substrate 8. The substrate may contain, for example, glass or borosilicate and have a size of, for example, 60×40 cm, 120×60 cm, or 110×140 cm. The device 1 comprises a housing 2 of layered material, for example a stack of sheet steel, a heat-proof insulating material, for example rock wool, and a graphite layer. The device furthermore comprises a process chamber 5 which is situated inside the housing 2. The process chamber 5 is provided with a respective first opening 6 and second opening 7 which can be sealed by means of doors for the substrate 8 to pass through the device via the first and the second opening, respectively, of the process chamber. The process chamber 5 may be made of graphite, borosilicate or fused silica. Furthermore, the device 1 may be provided with an inlet port 3 and an outlet port 4 between which the process chamber 5 is arranged. The inlet port 3 and the outlet port 4 can be sealed and are provided with doors for allowing a substrate 8 in or out. The inlet port and the outlet port may also be made of graphite, borosilicate or fused silica. The process chamber 5 may furthermore be provided with electric heating elements, for example quartz elements 9 for producing a desired temperature profile in the process chamber 5. The temperature range within the profile may in this case be set in a range of, for example, 300 to 550° Celsius.

The device may be provided with transport rollers 15 for moving the substrate 8 from the inlet port 3 to the outlet port 4 via the first opening 6 and second opening 7 in the process chamber 5. The transport rollers 15 may be made of fused silica and have a length of 80 cm and a diameter of 100 mm, for example. The transport rollers may be provided with a drive (not shown). The device may comprise several, for example three or five, process chambers, with it being possible to set each process chamber to a desired temperature profile.

The transport rollers 15 may be rotatably attached to the housing 2 to enable transport of the substrate 8 inside the process chamber 5.

The dimensions of the process chamber 5 may be chosen such that several substrates 8 can be processed in a single process chamber 5.

The device 1 may also be provided with a gas inlet 30 to enable a purge gas to flow into the housing, for example an inert gas, such as nitrogen ($N_2$), in order to produce a low-oxygen environment in the space between the housing 2 and the process chamber 5, thus preventing the graphite material of, for example, the walls of the process chamber 5 from combusting.

In addition, the device may be provided with a vacuum pump 31 for applying a vacuum inside the housing 2. The pressure inside the device may be set in a range between 0.001 and 1100 mbar absolute.

The device is also provided with an evaporator device 10 which is connected to the process chamber 5 via a first supply duct 12 and a first inlet 11. The evaporator device 10 is designed to melt and evaporate a material which is to be applied to the substrate, for example selenium, and may be provided with electric heating elements for heating the selenium to above the melting temperature of the selenium. The temperature of the liquid selenium in the evaporating device may be set in a range between 420° C. and 500° C. Another example of a material which is to be applied may be silver (Ag) or sulphur (S).

By allowing a transport gas, for example nitrogen, to flow into the evaporator device 10 via a separate inlet 19, the selenium in vapour form can be conducted in a process gas to the process chamber 5 via the supply duct 12 and the first inlet 11. The temperature of the process gas is, for example, 500° C.

Due to the temperature profile of the substrate 8 which is set as desired and the controlled vapour pressure of the selenium vapour, the recrystallization of the selenium on the substrate 8 can take place in the process chamber 5 at a desired phase transition.

Furthermore, the process chamber 5 is provided with a first outlet 13 and a first transport member, for example a first connecting duct 14 for discharging an off-gas from the process chamber. The off-gas comprises part of the process gas which may comprise the evaporated selenium and nitrogen N2, and possibly also impurities, for example sulphur. The temperature of the off-gas as it leaves the process chamber is, for example, 500° C. The first transport member may optionally also comprise a pump.

The device furthermore comprises a first condensation device 16 which is connected to the first outlet 13 of the process chamber 5 via the first connecting duct 14 in order to receive the off-gas. The first condensation device 16 is designed to condense the selenium in vapour phase in the off-gas, the selenium being deposited in a solid phase, for example flakes. This is achieved by cooling the off-gas to a temperature of, for example, 200° C. The first condensation device 16 is also referred to as a "cold trap". The first condensation device may also be provided with a filter 40, for example a HEPA filter for filtering residual particles from the off-gas, so that only the transport gas is allowed to pass through to a pump 41.

The device 1 is furthermore provided with a second condensation device 17 for condensing part of the selenium in vapour phase in the off-gas to form a liquid phase. The second condensation device 17 connects the first condensation device 16 to the process chamber 5 via the first connecting duct 14. The device is furthermore provided with a second transport member, for example a second connecting duct 18, between the evaporator device 10 and the second condensation device 17 for returning the liquid selenium to the evaporator device 10. The second transport member may possibly also comprise a pump.

In an embodiment, the device may be provided with a third transport member, for example a third connecting duct 23, which is arranged between the second condensation device 17 and the first condensation device 16 and is designed to transport the off-gas from the second condensation device to the first condensation device.

The temperature of the off-gas as it enters the second condensation device 17 is, for example, 500° C. The temperature inside the second condensation device 17 is set to a temperature at which the off-gas is cooled to below the dew point of the selenium, for example 400° C., as a result of which part of the selenium is deposited. The temperature of the residual gas which leaves the second condensation device 17 may be, for example, 300° C. The second connecting duct 18, the evaporator device 10 and the second condensation device 17 may be arranged in such a way that a first liquid level 27 of the liquid selenium in the evaporator device 10 which is to be evaporated is substantially equal to a second liquid level 20 of the liquid selenium in the second condensation device 17. By means of the second connecting duct 18, the selenium in the evaporating device which is evaporated and discharged can be partially replenished with the recovered selenium which is discharged from the process chamber 5 via the off-gas. In this embodiment, the second connecting duct 18 is connected to the first end 21 of the second condensation device 17 and also serves as a gas separation between the evaporator device 10 and the second condensation device 17. The second condensation device 17 is also referred to by the term "warm trap".

FIG. 2 schematically shows a cross section of the second condensation device 17. The second condensation device 17 can furthermore be provided with a heating device 28 designed to heat the liquid selenium to a temperature which is at least higher than the temperature of the melting point of the selenium. This temperature is, for example, 300° C. In an embodiment, the heating device is designed to heat the off-gas in the second condensation device 17 to a temperature which is at least higher than the temperature of the dew point of an impurity in the off-gas, for example sulphur (S) which is present in the off-gas in vapour form and which can be discharged as a residue via the third connecting duct 23 to the first condensation device 16. In an embodiment, the second condensation device 17 may be provided with a labyrinth system 24 which comprises a plurality of plates 25 for at least part of the off-gas to pass through, wherein the labyrinth system is arranged between the first end 21 and the second end 22 of the second condensation device 17. In addition, the plates may be provided with holes, and the plates may extend below the second liquid level 20. The plates 25 may be made of ceramic material or graphite.

Filtering means may optionally be arranged in the second condensation device 17, which filtering means ensure that the condensed selenium is deposited from the gas stream and is not transported as aerosol particles from the second condensation device by the off-gas stream. The device 1 may also be provided with a liquid level sensor device 26 for recording the liquid level of the liquid selenium in the second condensation device 17. The liquid level sensor device is of a capacitive type, for example, which is known to the person skilled in the art.

Furthermore, the device may be provided with a filling device 44 for receiving and melting new selenium which is to be supplied, which filling device is connected to the second end 22 of the second condensation device.

The device described above allows the following method for applying a material to a substrate to be carried out, which method comprises the following steps:

evaporating the material, for example selenium, by melting the selenium to form a liquid and evaporating the liquid;
supplying the process gas to the process chamber 5, said gas comprising part of the selenium in the vapour phase;
crystallizing part of the selenium from the process gas on the substrate 8;
discharging an off-gas from the process chamber 5, said off-gas comprising part of the process gas;
condensing at least part of the selenium from the off-gas to form a condensate;
supplying the condensate to the liquid selenium.

FIG. 3 diagrammatically shows part of a second embodiment of the device for heating a substrate according to a predetermined temperature profile for crystallizing a material on the substrate. The construction of the second embodiment of the device 100 is partially the same as the first embodiment of the device 1. The second embodiment also comprises a housing 2, a process chamber 5, a first condensation device (the cold trap) 16, and a second condensation device (a warm trap) 17, as described in relation to FIG. 1. The device may be provided with transport rollers 15 for moving the substrate 8 from the inlet port 3 to the outlet port 4 via the first opening 6 and second opening 7 in the process chamber 5. The transport rollers 15 may be made of fused silica and have, for example, a length of 80 cm and a diameter of 100 mm. The device may comprise several, for example three or five, process chambers, with it being possible to set each process chamber to a desired temperature profile.

The transport rollers 15 are rotatably attached to the housing to enable transport of the substrate 8 inside the process chamber 5. The transport rollers 15 are rotatably connected to the wall of the process chamber 5 by means of a passage 32. The passage 32 may be provided with a seal which contains a discharge duct 33 for discharging a leakage gas comprising the process gas which leaks from the process chamber 5 and/or a purge gas which leaks from the housing 2. The discharge duct 33 may adjoin all of the passages 32 of the transport rollers 15 of the process chamber.

The second embodiment also comprises a third condensation device 36 which has the same construction as the first condensation device 16 and is also a cold trap, and a fourth condensation device 37 which has the same construction as the second condensation device 17 and is also a warm trap. The third condensation device 36 is connected to the discharge duct 33 via the fourth condensation device 37. The third condensation device 36 is designed to condense the selenium in vapour phase from the leakage gas, with the selenium being deposited in a solid phase, for example flakes. This is achieved by cooling the off-gas to a temperature of, for example, 200° C.

The third condensation device 36 may also be provided with a filter 40, for example a HEPA filter 40, for filtering residual particles from the leakage gas, so that only the transport gas is allowed to pass through to a pump 42.

The device is also provided with a fourth transport member, for example a fourth connecting duct 38, between the fourth condensation device 37 and the second condensation device 17 for transporting the liquid selenium between the fourth condensation device 37 via the fourth connecting duct 38, the second condensation device 17 and the second connecting duct 18 to the evaporating device 10, so that the recovered selenium can be reused. The temperature of the leakage gas when it enters the fourth condensation device 37 is, for example, 500° C.

In an embodiment, the device may be provided with a fifth transport member, for example a fifth connecting duct 39, which is arranged between the fourth condensation device 37 and the third condensation device 36 and is designed to transport the leakage gas from the fourth condensation device 37 to the third condensation device 36.

The advantage of using the first and the second condensation device 16, 17 and the third and the fourth condensation device 36, 37, respectively, is that the off-gas stream through the first connecting duct 14 and the leakage gas stream through the discharge duct 33 can be set substantially independently of one another.

In an embodiment, the discharge duct may also be connected to another extraction opening, for example near the sealable openings 6, 7 of the process chamber 5. In another embodiment, several process chambers 5 may be connected to the second condensation device 17 and the discharge ducts 33 of the passages 32 of the several process chambers may be connected to the fourth condensation device 37.

The present invention is not limited to the preferred embodiments thereof which are described herein. Rather, the rights sought are defined by the following claims, which allow for numerous modifications.

The invention claimed is:

1. Device (1) for heating a substrate (8) according to a predetermined temperature profile for crystallizing a material on the substrate, provided with
at least one process chamber (5) which is provided with a first and a second sealable opening (6; 7) for a substrate (8) to pass through, a first inlet (11) for receiving a process gas in the process chamber and a first transport member (14) for discharging an off-gas from the process chamber;
an evaporator device (10) for evaporating the material, which evaporator device (10) is connected to the process chamber (5) for supplying the process gas to the process chamber, wherein the process gas is partially saturated with the material in vapour phase;
a first condensation device (16) for receiving the off-gas, which device is connected to the process chamber (5) via a first transport member (14) for transporting the off-gas to the first condensation device (16), wherein the first condensation device (16) is designed to condense the material in the vapour phase in the off-gas to form a solid phase;
wherein the device is further provided with:
a second condensation device (17) for condensing part of the material in vapour phase in the off-gas to form a liquid phase, which second condensation device (17) connects the first condensation device (16) to the process chamber (5) via the first transport member (14); and a second transport member (18) between the evaporator device (10) and the second condensation device (17) for transporting condensed material from the second condensation device (17) to the evaporator device (10).

2. Device according to claim 1, wherein the first transport member comprises a first connecting duct (14).

3. Device according to claim 1, wherein the second transport member comprises a second connecting duct (18), wherein the second connecting duct (18), the evaporator device (10) and the second condensation device (17) are arranged in such a way that a first liquid level (27) of the material in the liquid phase which is to be evaporated is substantially equal to the liquid level (20) of the material liquid phase which is to be condensed.

4. Device according to claim 3, wherein the second connecting duct (18) connected to the first end (21) of the second condensation device.

5. Device according to claim 1, wherein the device comprises a third transport member (23) which is arranged between the second condensation device (17) and the first condensation device (16) and is designed to transport the off-gas from the second condensation device (17) to the first condensation device (16).

6. Device according to claim 5, wherein the third transport member comprises a third connecting duct (23).

7. Device according to claim 1, wherein the second condensation device (17) is provided with a heating device (28) which is designed to heat the material in the liquid state which is to be condensed to a temperature which is at least higher than the temperature of the melting point of the material.

8. Device according to claim 7, wherein the heating device (28) is designed to heat the off-gas in the second condensation device to a temperature which is at least higher than the temperature of the dew point of an impurity in the off-gas.

9. Device according to claim 8, wherein the impurity comprises sulphur.

10. Device according to claim 1, wherein the second condensation device (17) is provided with a labyrinth system (24) comprising a plurality of plates (25) for at least part of the off-gas to pass through, wherein the labyrinth system is arranged between the first end and the second end of the second condensation device.

11. Device according to claim 10, wherein the plates (25) extend below a liquid level (20) of the material in liquid phase which is to be condensed.

12. Device according to claim 1, wherein the device is provided with transport axles which are rotatably arranged in the process chamber and passages in the process chamber for rotatably attaching the transport axles, which passages (32) are provided with a discharge duct (33) which connects the passages for discharging a leakage gas.

13. Device according to claim 12, wherein the device is provided with a third condensation device (36) for receiving the leakage gas via the first discharge duct (33) for transporting the leakage gas to the third condensation device (36), wherein the third condensation device (36) is designed to condense the material in the vapour phase in the leakage gas to form a solid phase;

a fourth condensation device (37) for condensing part of the material in vapour phase in the leakage gas to form a liquid phase, which fourth condensation device (37) connects the third condensation device (36) to the discharge duct (33); and a fourth transport member (38) between the fourth condensation device (37) and the evaporating device (10) for transporting condensed material from the fourth condensation device (37) to the evaporating device (10).

14. Device according to claim 2, wherein the second transport member comprises a second connecting duct (18), wherein the second connecting duct (18), the evaporator device (10) and the second condensation device (17) are arranged in such a way that a first liquid level (27) of the material in the liquid phase which is to be evaporated is substantially equal to the liquid level (20) of the material liquid phase which is to be condensed.

15. Device according to claim 14, wherein the second connecting duct (18) connected to the first end (21) of the second condensation device.

16. Device according to claim 2, wherein the device comprises a third transport member (23) which is arranged between the second condensation device (17) and the first condensation device (16) and is designed to transport the off-gas from the second condensation device (17) to the first condensation device (16).

17. Device according to claim 3, wherein the device comprises a third transport member (23) which is arranged between the second condensation device (17) and the first condensation device (16) and is designed to transport the off-gas from the second condensation device (17) to the first condensation device (16).

18. Device according to claim 4, wherein the device comprises a third transport member (23) which is arranged between the second condensation device (17) and the first condensation device (16) and is designed to transport the off-gas from the second condensation device (17) to the first condensation device (16).

* * * * *